United States Patent [19]
Padula et al.

[11] Patent Number: 5,365,791
[45] Date of Patent: Nov. 22, 1994

[54] SIGNAL GENERATOR

[75] Inventors: Santo A. Padula, Lake Orion, Mich.; Duane R. Johnson, Wellington, Ohio

[73] Assignee: Allied-Signal Inc., Morristown, N.J.

[21] Appl. No.: 974,648

[22] Filed: Nov. 10, 1992

[51] Int. Cl.[5] .............................................. G01L 9/14
[52] U.S. Cl. .................. 73/745; 73/DIG. 3; 338/32 H
[58] Field of Search ............ 73/745, DIG. 3, 119 A; 338/32 H

[56] References Cited

U.S. PATENT DOCUMENTS

| | | | |
|---|---|---|---|
| 4,079,804 | 3/1978 | Paillard | 180/103 BF |
| 4,196,936 | 4/1980 | Snyder | 303/20 |
| 4,253,090 | 2/1981 | Storie et al. | 340/323 R |
| 4,315,214 | 2/1982 | Kataoka | 324/208 |
| 4,397,180 | 8/1983 | Wolff | 73/119 A |
| 4,598,953 | 7/1986 | Wood et al. | 330/6 |
| 4,616,188 | 10/1986 | Stitt et al. | 330/6 |
| 4,726,627 | 2/1988 | Frait et al. | 303/24 R |
| 4,762,205 | 8/1988 | Ortman | 188/71.2 |
| 4,784,442 | 11/1988 | Petersen | 303/15 |
| 4,818,036 | 4/1989 | Reinecke | 303/50 |
| 5,022,714 | 6/1991 | Breen | 303/7 |
| 5,033,798 | 7/1991 | Breen | 303/7 |
| 5,061,015 | 10/1991 | Cramer et al. | 303/7 |
| 5,115,185 | 5/1992 | Reinartz et al. | 324/207.22 |

FOREIGN PATENT DOCUMENTS

| | | |
|---|---|---|
| 2646505 | 2/1990 | France . |
| 1473854 | 6/1969 | Germany . |
| 4124424 | 7/1993 | Germany . |

OTHER PUBLICATIONS

Proceedings of the IEEE, vol. 69, No. 4, Apr. 1981 New York, pp. 491–492, Y. Netzer "A Very Linear Noncontact Displacement Measurement with a Hall--Element Magnetic Sensor".
Electronics Express, vol. 9, No. 7, 9, 1967, 7 P. 68 Electron.

Primary Examiner—Donald Woodiel
Attorney, Agent, or Firm—Ken C. Decker

[57] ABSTRACT

A signal generator for generating an electrical signal which varies in accordance with movement of an actuating member includes a plunger slidable mounted within a housing which carries a pair of permanent magnets for generating a magnetic field to be applied to a hall effect generator. As the plunger is moved relative to the hall effect generator, the magnets are also moved relative to the hall effect generator, thereby varying the magnetic field applied thereto. Accordingly, a variable output signal is generated as a function of the position of the input member.

7 Claims, 3 Drawing Sheets

SIGNAL GENERATOR

This invention relates to a signal generator, particularly a signal generator for generating electrical signals for controlling a vehicle braking system.

Present heavy duty vehicles are equipped with an air brake system which is controlled by a driver actuated control valve. The control valve generates a pneumatic pressure signal or signals which are directly responsive to the degree to which the driver has depressed the vehicle brake pedal. These pneumatic signals are used to actuate pressure responsive devices to effect a vehicle brake application. More recently, electropneumatic brake systems have been proposed to enhance braking performance and also to simplify the pneumatic connections required, principally by eliminating the pneumatic connections now required in the vehicle operator's compartment.

An electropneumatic braking system uses a microprocessor to generate signals controlling electropneumatic actuators in order to effect brake application. The microprocessor is responsive to electrical signals which are generated by the vehicle operator in lieu of the pneumatic signals generated in existing braking systems. Of course, it is necessary for such electropneumatic signal generators to be accurate and to be extremely durable. In addition to the normal foot valve, in which braking pressure is varied as a function of the distance that the brake pedal was depressed, existing wholly pneumatic systems also use various hand control valves to effect the service brake application. For example, such systems also include "push/pull" control valves to actuate the vehicle's parking brakes. Furthermore, two-position control valves are used to generate pneumatic signals actuating auxiliary pneumatically operated appliances. In any wholly electricalpneumatic system, each of these devices must be replaced by an electropneumatic analog which generates an electrical signal in response to operation thereof by the vehicle operator, instead of the pneumatic signals generated by current devices.

Prior art electrical signal generators used for generating electropneumatic brake actuating signals are disclosed, for example, in U.S. Pat. No. 4,818,036. This reference discloses a signal generator which uses an electrical coil and a core piece which is dropped into the electrical coil by depressing the brake pedal. The present invention, however, discloses a brake signal transmitter which uses a hall effect signal generator which is mounted within a housing. A plunger, the position of which is controlled by the vehicle operator, carries two permanent magnets. Accordingly, the position of the magnets can be varied relative to the hall effect signal generator, causing the latter to generate an output signal which varies as a function of the position of the magnets. The hall effect signal generator is a device well known to those skilled in the art which generates an output signal which varies according to the magnetic field applied to the hall effect generator. By varying the position of the permanent magnets relative to the hall effect signal generator which is controlled by the vehicle operator, the vehicle operator can also vary the output signal, thereby providing a variable brake actuation signal. An important advantage of the device is that the movable parts do not contact one another; accordingly no wear results, and the useful life of the device should be indefinite.

These and other advantages of the present invention will become apparent from the following description, with reference to the accompanying drawings, in which.

Figure 1:
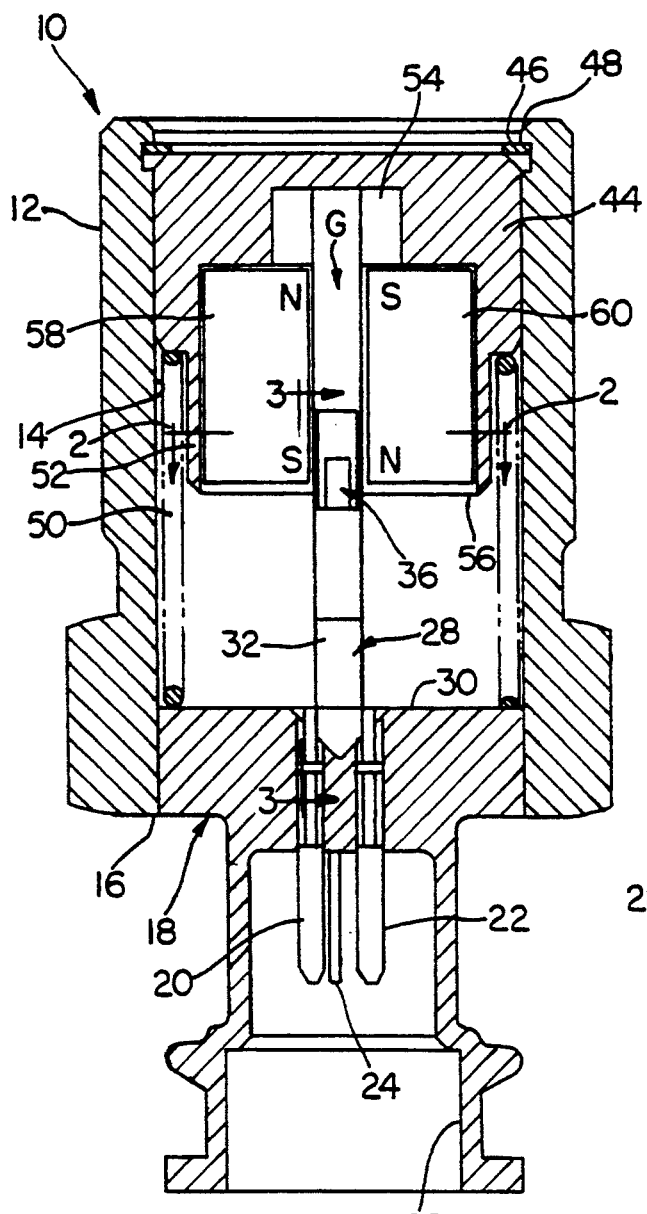
FIG. 1 is a longitudinal cross-sectional view of a signal generator made pursuant to the teachings of the present invention.
Figure 2:
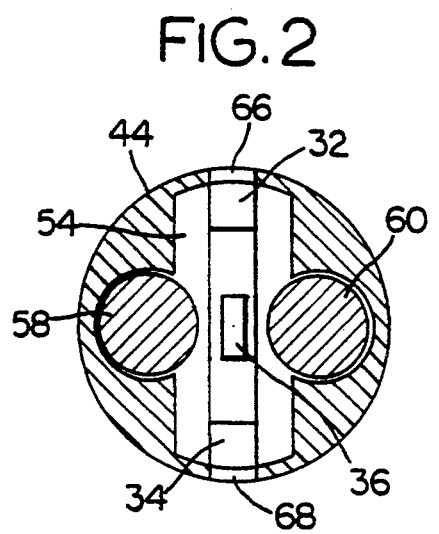
FIG. 2 is a view taken substantially along lines 2—2 of FIG. 1.
Figure 3:
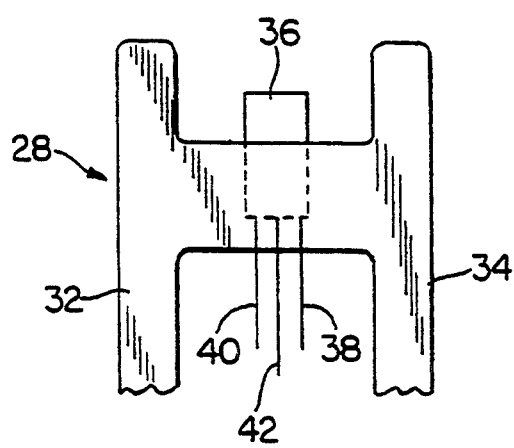
FIG. 3 is an enlarged, fragmentary view taken substantially along lines 3—3 of FIG. 1.

Referring now to FIG. 1-3 of the drawings, a single generator module is indicated by the numeral 10 and includes a housing 12 defining a bore 14 therewithin having an open end 16 receiving a plug 18. Plug 18 includes a standard three-prong receptacle, including conductors 20, 22 and 24, which are adapted to mate with a plug (not shown) received within cavity 26 to thereby connect the signal generating module to the aforementioned microprocessor. An arm 28 projects into the bore 14 from the end 30 of the plug 18. The arm 28 includes two axially extending guide arms 32, 34 which carry a conventional hall effect signal generator generally indicated by the numeral 36. The hall effect signal generator is an integrated circuit of a type well known to those skilled in the art, and may be, for example, an integrated circuit sold as Model No. 3503 by Allegro, Inc. The hall effect signal generator 36 is connected to the conductors 20, 22 and 24 through conductive leads 38, 40, 42 which connect corresponding ones of the conductors 20, 22 or 24. One of the conductors grounds the integrated circuit hall effect signal generator 36; one of the remaining conductors supplies power to the generator 36, and the remaining conductor carries an output signal generated by the signal generator 36. As is well known to those skilled in the arts, the hall effect signal generator 36 responds to an electromagnetic field to generate an output signal which varies as a function of the strength of the field.

A plunger 44 is slidably mounted in the bore 14 and is yieldably urged into engagement with a snap ring 46 which circumscribes open end 48 of the housing 12. The plunger 44 is urged into engagement with the snap ring 46 by a conventional coiled spring 50. The plunger 44 includes a circumferentially extending wall 52 defining a cavity 54 therewithin, having an open end 56. A pair of substantially cylindrical, permanent magnets 58, 60 are installed in correspondingly shaped recesses 62, 64 defined within the cavity 54. The magnets 58, 60 are arranged in attractive-pole configuration (i.e., north-/south poles of one magnet are arranged opposite the opposite poles of the other magnet, as illustrated in FIG. 1 of the drawing). The magnets 58, 60 are separated by a gap G, which is sufficiently wide to receive the suspension arm 28 carrying the hall effect generator 36 with an appropriate clearance. Although the use of two permanent magnets is preferred for maximum sensitivity, it is within the scope of the invention to use only a single permanent magnet. The plunger 44 is provided with diametrically opposed, axially extending slots 66, 68 which receive guide arms 34, 32 of the suspension arm 28 respectively, to properly guide the plunger 44 relative to the suspension arm 28.

In operation, the magnetic field between the magnet 58, 60 will be substantially zero at about the midpoint of the magnets. In the position illustrated in the drawing, where the hall effect generator is placed just outside the lower ends of the magnets, the magnetic field applied to the hall effect generator 36 will be at a maximum. As the plunger 44 is moved downwardly, viewing the Figure, the magnetic field applied to the hall effect generator 36 will decrease to a minimum value about midway along the length of the magnets, and then will gradually increase again as the magnets are lowered. However, in this position the magnetic field applied to the hall effect signal generator 36 will be in a direction opposite to the direction of the magnetic field applied to the hall effect signal generator 36 when the latter is moved toward the lower ends of the magnets. Since the signal generated on the output terminal of the hall effect signal generator 36 varies as a function of the magnetic field (and also its direction) a negative signal will be generated by the hall effect generator 36 in the position illustrated in the drawings. As the plungers move downwardly, this negative signal will decrease to zero about midway along the length of the magnets and then will increase proportionally to a positive value corresponding to the negative value at the opposite end of the magnet as the hall effect generator extends out of the upper ends of the magnets, viewing FIG. 1. Accordingly, the signal generated by the hall effect signal generator increases linearly as the plunger 44 is moved downwardly, viewing FIG. 1. Since the hall effect signal generator 36 and the arm 28 are guided in the gap G by the guide arms 32 and 34, there is no direct mechanical contact between the magnets and the suspension arm 28 and hall effect generator 36, so that no mechanical wear is exerted on any of the components. Accordingly, unless the signal is damaged by an external force, the module 10 should last indefinitely.

Figure 4:
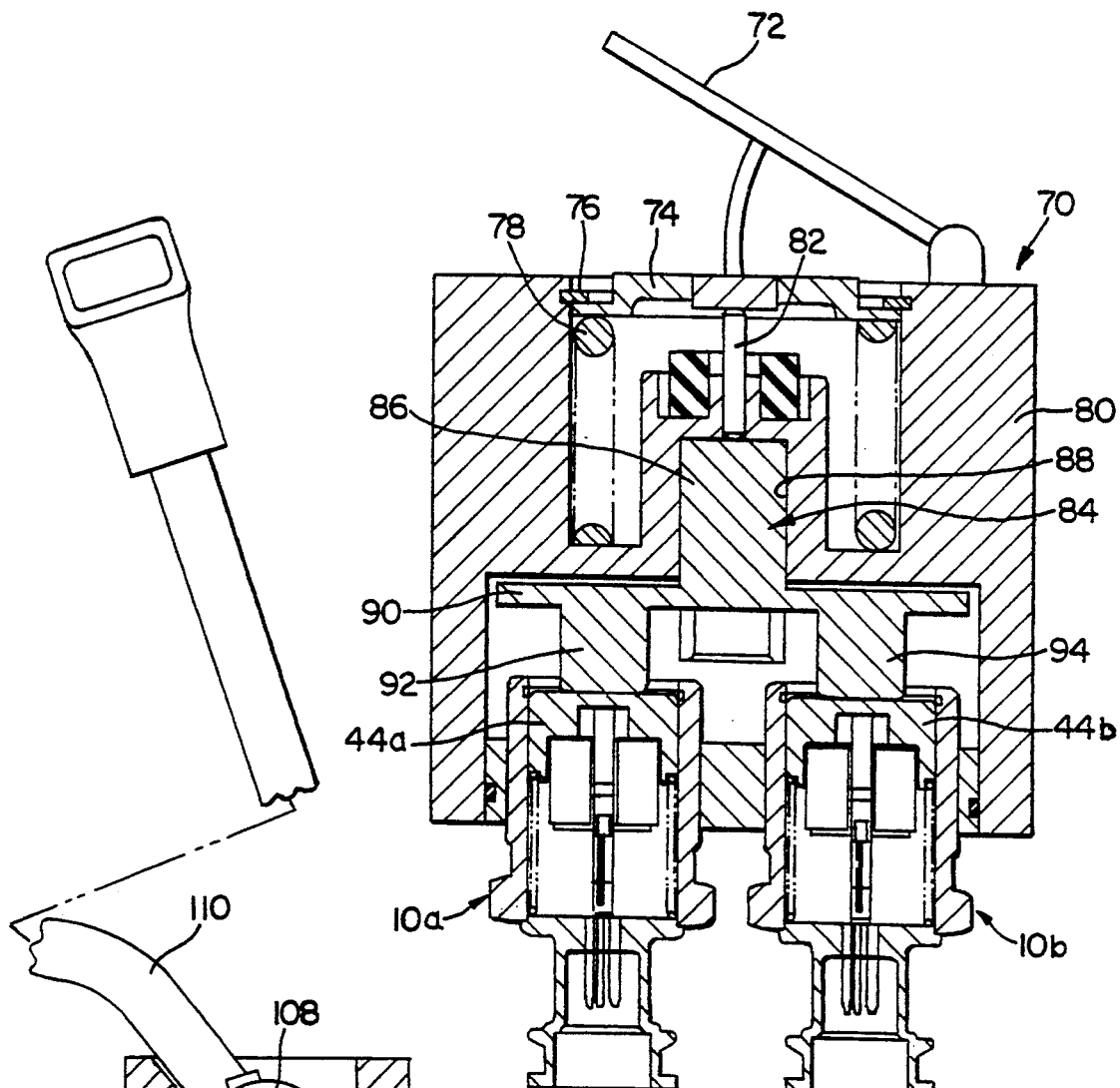
FIG. 4 is a cross-sectional view of a foot operated brake pressure signal generator which uses the signal generator modules illustrated in FIGS. 1-3.

Referring now to FIG. 4, a dual foot operated signal generator is indicated by the numeral 70. Conventional pneumatic brake valves generate two independent brake actuating pneumatic signals which control each of two independent braking systems. Accordingly, the dual generator 70 generates two independent electrical signals which can be used to independently actuate each of two separate sets of electropneumatically controlled vehicle brakes, or one signal is used to backup the other signal. Dual signal generator 70 includes a foot operated treadle indicated schematically at 72, which, when actuated by the vehicle operator, depresses a pressure plate 74 which is urged into engagement with a snap ring 76 with a relatively heavy feedback spring 78. The pressure plate 74 and spring 78 are mounted for sliding movement in a housing 80. Motion of the pressure plate 74 is transmitted through a pin 82 to a control member generally indicated by the numeral 84. Control member 84 includes a projecting boss 86 which is slidably received in a bore 88 defined within the housing 80 so that movement of the control member 84 is constrained to move along the axis of the pin 82 and the boss 86. The control member 84 includes projecting portion 90 and two circumferentially spaced projecting portions 92, 94, which project axially from the portion 90. The projecting portions 92, 94 engage corresponding plungers 44a, 44b, of two separate and independent signal generating modules 10a and 10b. The modules 10a and 10b are identical with one another and are also identical to module 10 FIGS. 1-3 described hereinabove. Accordingly, two separate sets of the magnets 58, 60 and two separate hall effect generators 36 are present within the dual signal generator 70. Accordingly, when a brake application is effected by depressing the treadle 72, simultaneous signals are generated by the signal generating modules 10a, 10b.

Figure 5:
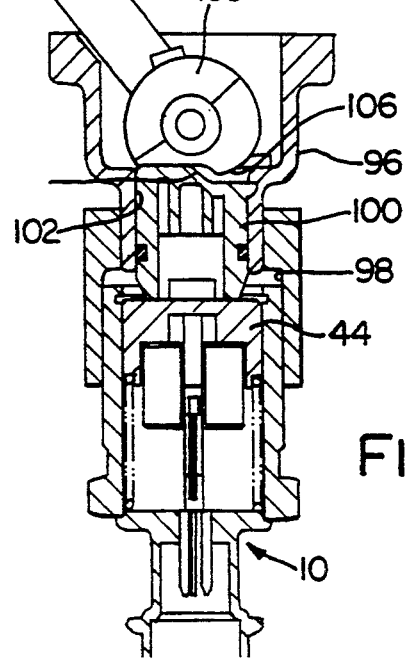
FIG. 5 is a hand operated brake pressure signal generator which uses the signal generator modules of FIGS. 1-3.

Referring now to FIG. 5, a hand operated brake pressure signal generating device includes a housing 96 in which a module 10, identical to the module 10 in FIGS. 1-3, is received in a bore 98 defined within the housing 96. A secondary plunger 100 is slidably mounted in reduced portion 102 of the bore 98, and is substantially coaxial with the plunger 44 of the module 10. The upper end (viewing FIG. 5) of the plunger 102 is provided with a camming surface 104 which cooperates with a corresponding camming surface 106 on a hub 108 of a lever arm 110. Lever arm 110 is operated by the vehicle operator to control braking, and is rotatable about an axis which substantially perpendicular to the axes of the secondary plunger 102 and the plunger 104. Accordingly, when the handle 110 is rotated clockwise, viewing the Figure, the plunger 44 is lowered from an initial position in which the hall effect signal generator is just outside the lower end of the module, thereby generating a signal which varies in accordance with the position of the handle 110.

Figure 6:
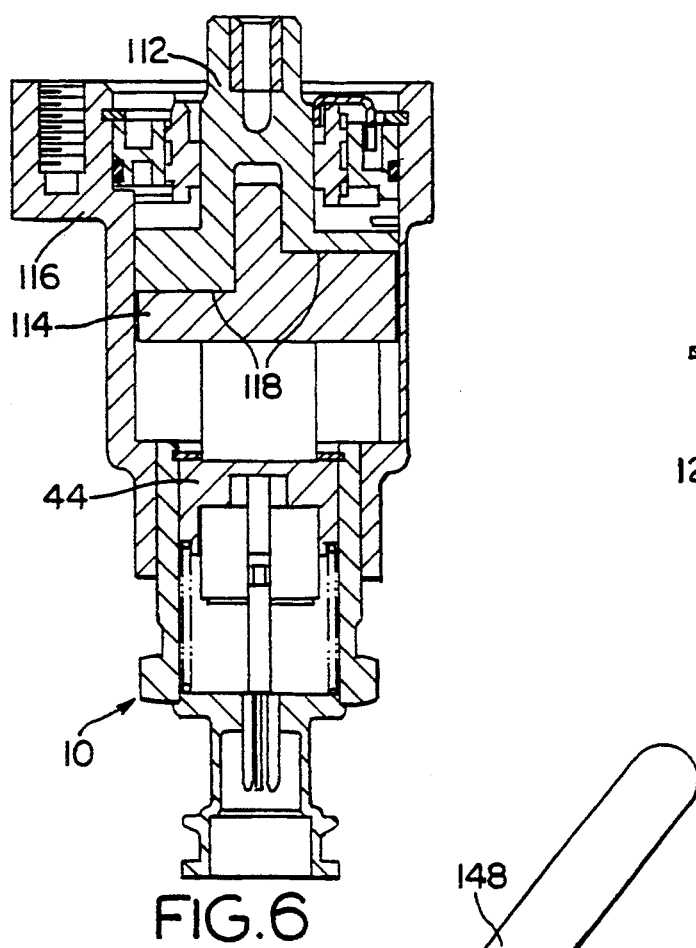
FIG. 6 is another embodiment of a hand operated brake pressure signal generator which uses a signal generated module made pursuant to FIGS. 1-3.

Referring now to FIG. 6, a signal generator similar to that of FIG. 5 is illustrated, except that the axis of the hub 112, instead of being perpendicular to the axis of the plunger 44 and a secondary plunger 114, is instead coaxial with that of the plungers 114, 44. The handle which rotates the hub 112 is not shown, but it is able to rotate the hub 112 in order to generate a variable electrical output signal. The hub 112 and secondary plunger 114 are each provided with cooperating, inclined ramp, camming surfaces generally indicated by the numeral 118. Accordingly, as the hub 112 is rotated, the secondary plunger 114 is displaced downwardly, thereby also depressing the plunger 44 to generate a variable electrical signal.

Figure 7:
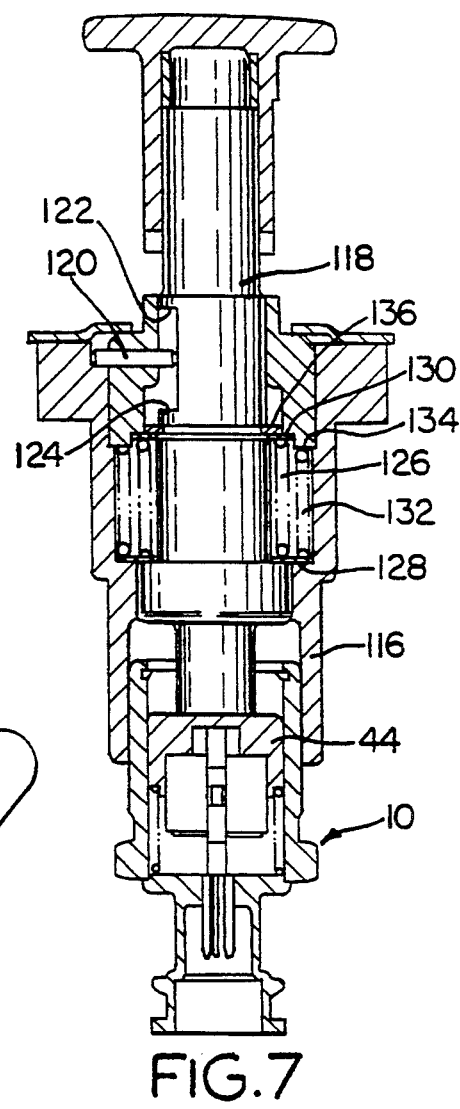
FIGS. 7 and 8 are cross-sectional views of push/pull actuators incorporating the signal generator module of FIGS. 1-3 in a device for controlling application and release of a vehicle parking brake system.
Figure 8:
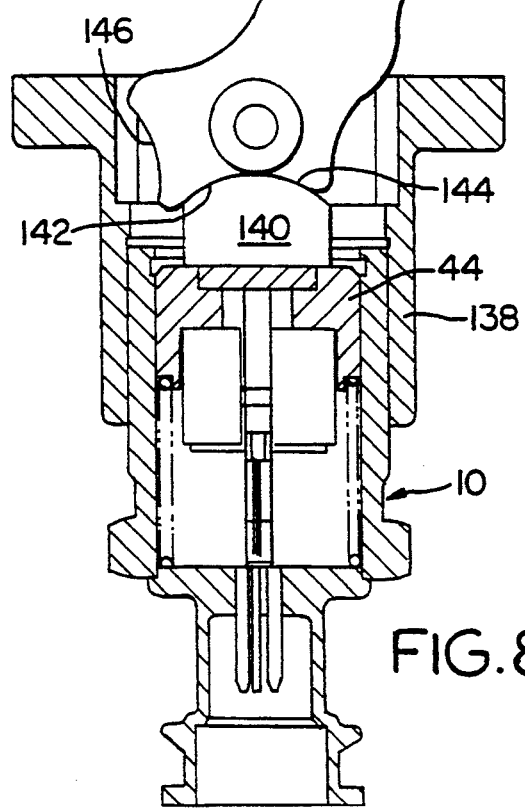

The signal generator of FIGS. 7 and 8 differ from those FIGS. 4-6 in that the devices of FIGS. 7 and 8 are two or three position signal generators. Referring to FIG. 7, the module 10 is secured to he bottom of a housing 116 in which a plunger 118 slides. The bottom of the plunger 118 engages the plunger 44 of the module 10 so that movement of the plunger 118 also effects movement of the plunger 44. Movement of the plunger 118 is limited by the engagement of a stop pin 120 with opposite shoulders 122, 124 on the plunger 118. The stop pin also prevents rotation of the plunger 118. A coil spring 126 is compressed between washers 128, 130 within housing 116. A secondary spring 132 is compressed between the washer 128 and shoulder 134. The washer 130 engages stop ring 136 carried on plunger 118. Accordingly, the plunger 118 is yieldably urged by spring 126 into a normal position in which the stop pin 120 is approximately half way between the shoulders 122 and 124. In this position, the hall effect signal generator 36 is at the minimum magnetic flux position, which, as discussed above, is about half of the way along the length of the permanent magnets. Accordingly, the signal generator of FIG. 7 can be moved to either of two actuated positions. The vehicle operator pushes downwardly on the plunger 118, the shoulder 122 engages the stop pin 120, and the magnets within the module 10 are lowered into the maximum magnetic flux position in which the hall effect generators are just outside of the upper ends of the magnets, viewing FIG. 7. On the other hand, the plunger 118 can be moved to the other actuated position if the vehicle operator pulls out the plunger 118 until the shoulder 124 engages the stop pin 120. The dual springs 126, 132 acting on the plunger require a force to pull the plunger 118 out larger than that required to push the plunger in, because spring 132 acts on the plunger 118 only when it is pulled outwardly. Accordingly, the magnets within the module 10 are raised until the hall effect generator is just outside the lower ends of the magnets, viewing FIG. 7, when the shoulder 124 engages the pin 120. This is the other actuated position of the signal generator of FIG. 7.

Referring to FIG. 8, a two position signal generator is illustrated in which the module 10 which again is essentially identical to the module 10 of FIGS. 1-3, is screwed into the lower end of a housing 138. A projecting member 140 is secured to the plunger 44 and is provided with a camming surface 142 which is adapted to engage of camming surfaces 144 or 146 defined on a lever 148, which may be moved into the position illustrated, in which the camming surface 144 engages the camming surface 142, to a position in which the surface 146 engages the surface 142. Accordingly, the plunger 44 carrying the magnets controlling the magnetic field across the hall effect generator is moved from a first relative position to a second relative position in which the magnetic flux is significantly changed in the second relative position as compared to the first relative position. Accordingly, the actuating signal produced by signal module 10 can be switched between two predetermined different values. Switches of this type are useful in actuating accessory devices used in pneumatic braking systems.

We claim:

1. Signal generator for generating an electrical signal which varies in accordance with movement of an input member comprising a housing defining a bore therewithin, means supporting a hall effect signal generator within said bore, means for supplying power to said hall effect signal generator and for carrying an output signal from said hall effect signal generator, said hall effect generator varying said output signal as a function of the strength of a magnetic field applied to the hall effect generator, and means for generating a magnetic field applied to said hall effect generator, said input member being movable in said bore for causing the magnetic field applied to said hall effect generator by said magnetic field generating means to vary as a function of the position of the input member whereby said output signal is also varied as a function of the position of the input member, said magnetic field generating means including a pair of permanent magnets within said housing, said magnets defining a gap therebetween for receiving said hall effect generator as the input member is move.

2. Signal generator as claimed in claim 1, wherein said input member is a plunger slidably mounted in said bore for movement toward and away from said hall effect generator.

3. Signal generator as claimed in claim 1, wherein a spring yieldably urges said input member away from said hall effect generator.

4. Signal generator as claimed in claim 1, wherein said input member is a plunger slidably mounted in said bore for movement toward and away from said hall effect generator, said plunger having a circumferentially extending wall defining a cavity therewithin having an open end, said magnets being mounted in said cavity, said hall effect generator being mounted on suspending means supporting said hall effect generator within said bore, said suspending means and said hall effect generator being received through the open end of said cavity.

5. Signal generator as claimed in claim 4, wherein said suspending means and said plunger include mutually cooperating guide means for orienting said plunger and therefore said magnets relative to said hall effect generator.

6. Signal generator for generating an electrical signal which varies in accordance with movement of an input member comprising a housing defining a bore therewithin, means supporting a hall effect signal generator within said bore, means for supplying power to said hall effect signal generator and for carrying an output signal from said hall effect signal generator, said hall effect generator varying said output signal as a function of the strength of a magnetic field applied to the hall effect generator, and means for generating a magnetic field applied to said hall effect generator, said input member being movable in said bore for causing the magnetic field applied to said hall effect generator by said magnetic field generating means to vary as a function of the position of the input member whereby said output signal is also varied as a function of the position of the input member, said input member being a plunger slidably mounted in said bore for movement toward and away from said hall effect generator, said plunger having a circumferentially extending wall defining a cavity therewithin having an open end, said magnetic field generating means being mounted in said cavity, said hall effect generator being mounted on suspending means supporting said hall effect generator within said bore, said suspending means and said hall effect generator being received through the open end of said cavity.

7. Signal generator as claimed in claim 6, wherein said suspending means and said plunger include mutually cooperating guide means for orienting said plunger and therefore said magnetic field generating means relative to said hall effect generator.

* * * * *